(12) United States Patent
Burkhart et al.

(10) Patent No.: US 6,291,777 B1
(45) Date of Patent: Sep. 18, 2001

(54) CONDUCTIVE FEED-THROUGH FOR CREATING A SURFACE ELECTRODE CONNECTION WITHIN A DIELECTRIC BODY AND METHOD OF FABRICATING SAME

(75) Inventors: Vincent E. Burkhart, San Jose; Michael N. Sugarman, San Francisco, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/251,691

(22) Filed: Feb. 17, 1999

(51) Int. Cl.[7] .................... H01R 12/04; H05F 23/00; B23B 5/22
(52) U.S. Cl. .................... 174/262; 174/266; 361/234; 279/128
(58) Field of Search .................... 361/236, 780, 361/792, 234; 174/262, 266, 250; 279/128

(56) References Cited

U.S. PATENT DOCUMENTS

| 3,346,689 | 10/1967 | Parstorfer | 174/68.5 |
|---|---|---|---|
| 3,601,523 | * 8/1971 | Lloyd | 174/264 |
| 4,095,866 | 6/1978 | Merrill | 339/17 |
| 4,383,363 | * 5/1983 | Hayakawa et al. | 29/847 |
| 4,665,468 | 5/1987 | Dohya | 361/414 |
| 5,155,652 | 10/1992 | Logan et al. | 361/234 |
| 5,191,506 | 3/1993 | Logan et al. | 361/234 |
| 5,243,142 | * 9/1993 | Ishikawa et al. | 174/262 |
| 5,450,290 | 9/1995 | Boyko et al. | 361/792 |
| 5,671,116 | * 9/1997 | Husain | 361/234 |
| 5,774,340 | * 6/1998 | Chang et al. | 358/1 |
| 5,879,787 | * 3/1999 | Petefish | 428/209 |
| 5,886,866 | * 3/1999 | Hausmann | 361/234 |
| 6,096,411 | * 8/2000 | Nakatani et al. | 428/209 |

FOREIGN PATENT DOCUMENTS

| 62-286249 | 12/1987 | (JP) | H01L/21/68 |
|---|---|---|---|
| 3-163849 | 7/1991 | (JP) | H01L/21/68 |

\* cited by examiner

*Primary Examiner*—Jeffrey Gaffin
*Assistant Examiner*—I B Patel
(74) *Attorney, Agent, or Firm*—Thomason, Moser & Patterson, LLP

(57) ABSTRACT

A conductive feed-through providing a conductive path through a dielectric body while maintaining differences in pressure between volumes separated by the dielectric body. A conductive feed-through of the present invention employs a hollow conductive tube created by first drilling a bore through the dielectric material. A first electrode is used to cover one end of the bore, and a vacuum-tight seal is formed around this first electrode. A second electrode is attached to the dielectric body at the other end of the bore. The inside surface of the bore is then coated with an electrically conductive material, and the coating provides a conductive path between the first electrode and the second electrode. In an alternative embodiment, the electrically conductive material coating is deposited such that it extends over the surface of the dielectric body so as to function as an electrode as well.

20 Claims, 5 Drawing Sheets

CONDUCTIVE FEED-THROUGH FOR CREATING A SURFACE ELECTRODE CONNECTION WITHIN A DIELECTRIC BODY AND METHOD OF FABRICATING SAME

BACKGROUND OF THE DISCLOSURE

1. Field of the Invention

The present invention relates to semiconductor wafer processing systems and, more particularly, to a conductive, vacuum tight feed-through that extends from one side of a dielectric body to another while maintaining a difference in pressure from one side of the body to the other.

2. Description of the Background Art

A semiconductor wafer processing system typically contains a process chamber within which a semiconductor wafer is processed. In a physical vapor deposition system, the interior of the process chamber is maintained at a specific temperature and pressure while a process gas is introduced into the chamber. The process gas is energized to form ions that impact a target such that target material is sputtered and deposited on the wafer.

The wafer is supported in the chamber by a pedestal, where the pedestal contains various components that provide heating and cooling of the wafer, as well as wafer clamping (chucking) to maintain the wafer in a stationary position during processing. Wafer retention is typically performed using an electrostatic chuck, which uses electrostatic force to retain the wafer upon the pedestal.

Generally, semiconductor wafer processing requires a gas pressure within the chamber that is different from atmospheric pressure. This different pressure is maintained in the process chamber above the pedestal and forms a process environment for the wafer. Due to the various components found within and below the pedestal, it is necessary to maintain atmospheric pressure (or some other pressure that is different from the pressure for the process environment) in a volume within the pedestal. Thus, the pedestal itself separates two volumes which are at different pressures. A detailed description of such a pedestal is described in a commonly assigned U.S. patent application Ser. No. 08/567,625, filed Dec. 5, 1995, and incorporated herein by reference.

In an electrostatic chuck, the pedestal requires one or more conductive feed-through connectors to provide a conductive path from one side of the pedestal to the other, e.g., from the low pressure volume to the high pressure volume. As such, in addition to coupling electrical signals through the chuck, it is also necessary for these feed-throughs to preserve the pressure difference found on either side of the pedestal, i.e., they must be vacuum sealed. One type of electrostatic chuck disclosed in commonly assigned U.S. patent application Ser. No. 08/873,268 filed Jun. 11, 1997, and hereby incorporated by reference, teaches the need for a conductive path to the surface of the chuck to provide wafer detection sensors. This specific embodiment avoided using a conductive feedthrough within the chuck itself by applying current to the gas feed through tubing. Commonly assigned U.S. patent application Ser. No. 08/834,702 filed Apr. 1, 1997 discloses feed-through construction for coupling voltage to electrodes embedded in the chuck using solid pins. The solid pin electrically contacts certain conductive layers embedded within the pedestal body.

However, there are disadvantages to using solid conductive pins. First of all, finish machining is necessary when a flatness requirement is imposed on the solid pin (i.e., when the pin must be flush with the surface of the pedestal). Finish machining involves a risk of contaminating or damaging the chuck surface material. If finish machining is to be avoided, extremely tight tolerances are necessary in the conducting pin and the joining of the pin to the pedestal. Second, stress in the ceramic body resulting from the mismatch in thermal coefficients of expansion between ceramic and metal can cause cracking in the ceramic and destroy the vacuum integrity of this joint.

Therefore, there is need in the art for a conductive feed-through that preserves the pressure difference without requiring the use of a solid conducting pin, as well as a method for fabricating such a feed-through.

SUMMARY OF THE INVENTION

The disadvantages associated with prior art conductive feed-throughs are overcome by the present invention. Beginning with a solid body of an electrostatic chuck, a bore is formed vertically into the surface of the body. This bore is extended completely through to the other side of the body, and can be formed by drilling, bead blasting, etching, or any other process used to generate bores in dielectric material, e.g., a ceramic such as aluminum nitride.

A first end of this bore is then covered using a conducting electrode (first electrode) that is of sufficient size to completely cover the first end of the bore. This first electrode is joined to the chuck body using a braze or similar joining method. As the first electrode is joined to the chuck body, a vacuum-tight seal is formed.

After the first end of the bore has been covered and sealed by the first electrode, the inside surface of the bore is then coated with a conducting material using chemical vapor deposition, physical vapor deposition, electroplating, brazing, or some other method of depositing the conductive material through the second end (i.e., the open end) of the bore. The conductive material thus electrically connects the first electrode with the currently open end of the bore. At this time, a second conductive electrode is joined to the second end of the bore and in electrical contact with the conductive material within the bore.

When these steps are completed, the result is a hollow conductive feed-through that provides electrical conductivity from one end of the bore to the other. The feed-through is similar to a conductive tube with an electrode sealing one end of the tube. These steps can be used to create any number of conductive feed-throughs in the chuck body.

In one illustrative application of the present invention, the chuck body is a Johnsen-Rahbek electrostatic ceramic chuck used in a physical vapor deposition process. Using the invention, a conductive path is produced from the first electrode at the sealed end of the bore to the second electrode at the open end of the bore such that one or more surface sensors can be located on the chuck surface and electrical signals can be coupled to the sensors without compromising the chamber vacuum.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
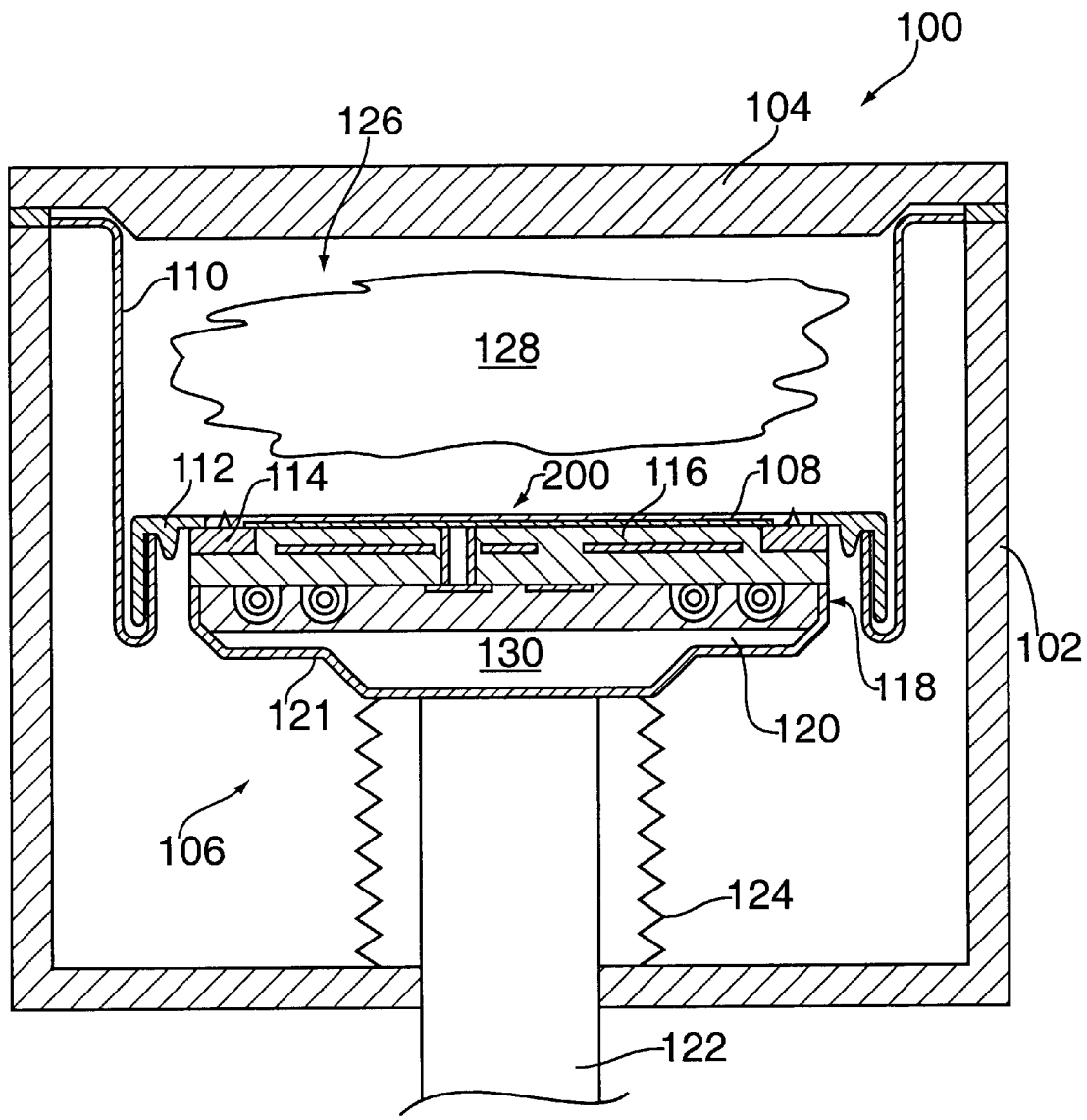
FIG. 1 depicts a cross-sectional schematic view of an illustrative PVD chamber incorporating the present invention.

FIG. 1 depicts a cross-sectional view of a physical vapor deposition (PVD) chamber 100 incorporating the present invention. The chamber 100 contains an enclosure 102 and a target 104 which define a volume within which a pedestal 106 supports a semiconductor wafer 108. A plasma zone is defined by a cylindrical member 110 which supports a cover ring 112 that rests upon a waste ring 114. During wafer processing, the waste ring 114 is supported by an electrostatic chuck 116. The waste ring 114 rests upon a flange extending circumferentially from the edge of the electrostatic chuck 116. The chuck is attached generally by a clamp, bolts, or a brazed joint 118 to a pedestal base 120. The pedestal base 120 includes a dish-shaped housing 121 that is supported by a shaft 122 which is sealed from the environment of the chamber by bellows 124. The bellows 124 are sealed to the bottom of the chamber enclosure 102 and also the support 120 at each end of the bellows. As such, the chamber volume 126 is separate and distinct from the pedestal volume 130.

An inert gas such as argon is introduced into the chamber 100 after a wafer 108 is positioned upon the electrostatic chuck 116. The gas is excited into a plasma 128 by applying a DC voltage between the chamber wall 102 and the target 104. The DC voltage ionizes the argon gas which then impacts the target material sputtering that material onto the wafer 108 supported in the chamber. The wafer 108 is retained by an electrostatic force that is generated between the wafer and the electrodes within the chuck. The invention is a feed-through structure 200 allowing for power and other electrical signals to be coupled from one side of the electrostatic chuck 116 to the other side of the electrostatic chuck 116. The novel feature of the conductive feed-through 200 is that the environment within the volume 130 beneath the chuck, i.e., within the pedestal and the bellows, is sealed from the chamber environment at the top of the electrostatic chuck 116 within the volume 126 where the plasma 128 is located. As such, cross-contamination can be avoided between the volumes 126 and 130, with the volume 130 typically being air at one atmosphere. Therefore, the invention permits a vacuum seal while still maintaining a conductive path through the electrostatic chuck 116 to the surface thereof.

Figure 2:
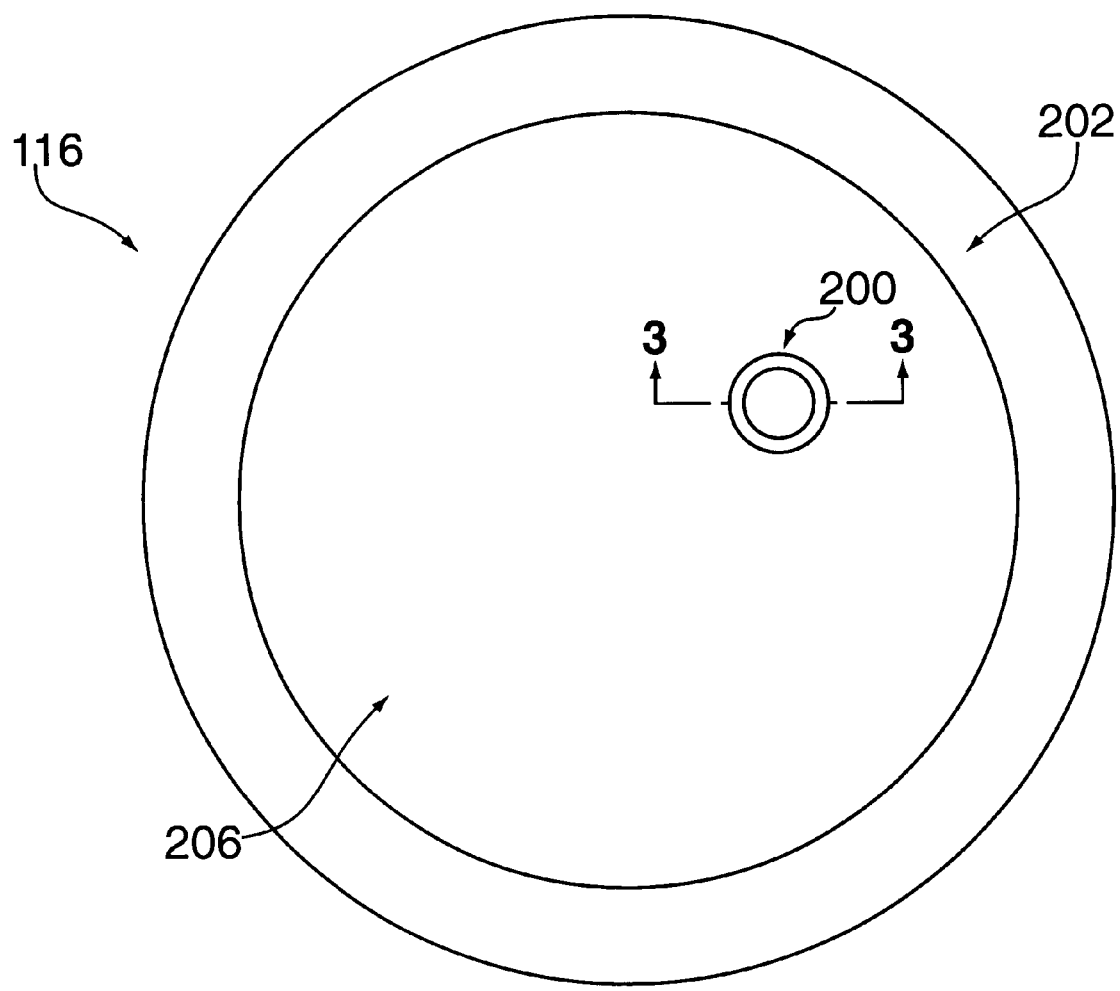
FIG. 2 depicts a top view of an electrostatic chuck incorporating the present invention.

FIG. 2 depicts a top view of an illustrative electrostatic chuck 116 containing the feed-through 200 of the present invention. In the illustrative example, the pedestal body is a Johnsen-Rahbek electrostatic ceramic chuck used to support the semiconductor wafer during a physical vapor deposition process. However, those skilled in the art will recognize that the conductive feed-through of the present invention can be used in any environment which requires a conductive, vacuum-sealed, feed-through in a dielectric body such as a ceramic heater assembly and the like.

The electrostatic chuck 116 has a circumferential mounting flange 202. During the semiconductor wafer process, the support surface 206 of the chuck body supports the wafer (108 in FIG. 1). In the illustrative embodiment shown, conductive feed-through 200 is used to provide a conductive path from an underside volume to the support surface 206. This feedthrough may be used to provide a conductive path to a sensor, to contact the wafer, or to a plurality of conductive contacts. Although FIG. 2 shows a single conductive feed-through 200, it will be understood by those skilled in the art that a plurality of feed-throughs 200 may be necessary and are formed in the same manner as feed-through 200.

Figure 3:
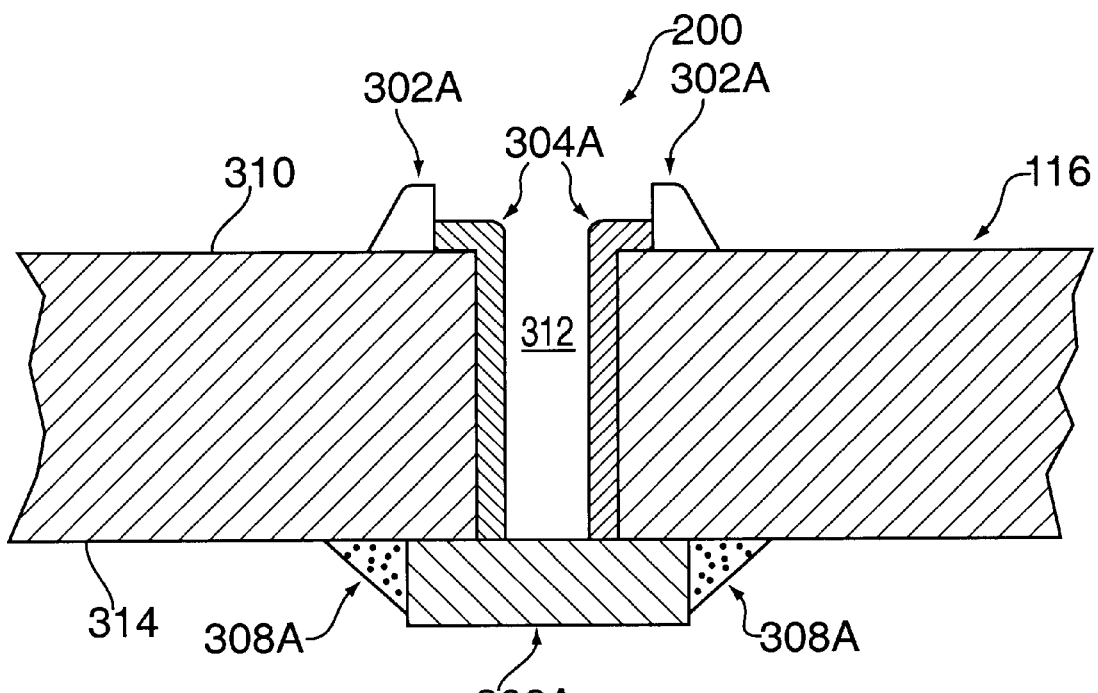
FIG. 3 depicts a cross-sectional view of the feedthrough of the present invention.

FIG. 3 depicts a cross-sectional view of a first embodiment of the conductive feed-through 200 of the present invention. This first embodiment includes a surface electrode 302A located on a first side (topside) 310 of the chuck 116 and surrounding the first side opening of a bore 312 extending through the chuck 116. The shape of the surface electrode 302A of the first embodiment is an annulus with a diameter larger than the diameter of the bore, and is made of an electrically conductive material, such as copper, gold, titanium nitride (TiN), aluminum, stainless steel, tungsten and the like.

An underside electrode 306A is joined to a second side (underside) 314 of the chuck 116 at a second end of the bore 312 using a vacuum-tight seal 308A. The underside electrode 306A is also made of an electrically conductive material. The seal 308A of the first embodiment is typically made of Cusil (copper silver) or a brazed joint; or other appropriate materials such as epoxy or glue for low temperature applications.

The inside surface 316 of the bore 312 is coated with another electrically conductive substance 304A, which may be a combination of materials or conductive films (organic or metallic); and may include, but not limited to Ti, TiN, aluminum or stainless steel, deposited by either physical vapor deposition (PVD), chemical vapor deposition (CVD), electroplating or brazing techniques. This coating of the inside surface provides an electrically conductive path between the surface electrode 302A and the underside electrode 306A. The coating thus creates a hollow feed-through 200 in the chuck 116 that provides a conductive path from the underside of the body to the topside without compromising the difference in pressure or atmospheres on each side of the chuck.

This feed-through is created using the following steps. First, a bore 312 is created which extends through the chuck body 116. The bore 312 can be created by drilling, etching, bead blasting, or any other process by which a bore can be created in the chuck 116. Then, the underside electrode 306A is joined to the chuck 116 to cover the underside opening of the bore. When the underside electrode 306A is joined, a braze or similar joining method is used to create a vacuum-tight seal 308A around the underside electrode 306A. A surface electrode 302A is also joined at the topside end of the bore 312. This surface electrode 302A, in the first embodiment, does not completely cover the topside opening of the bore, and it does not need to be joined with a vacuum-tight seal. Then, a conductive material 304A is deposited along the inside surface 316 of the bore 312 through a deposition process such as CVD, PVD, electroplating or brazing. Whatever process is used, it is important that the conductive material 304A is deposited to create an electrical contact with both the underside electrode 306A and the surface electrode 302A.

Figure 4A:
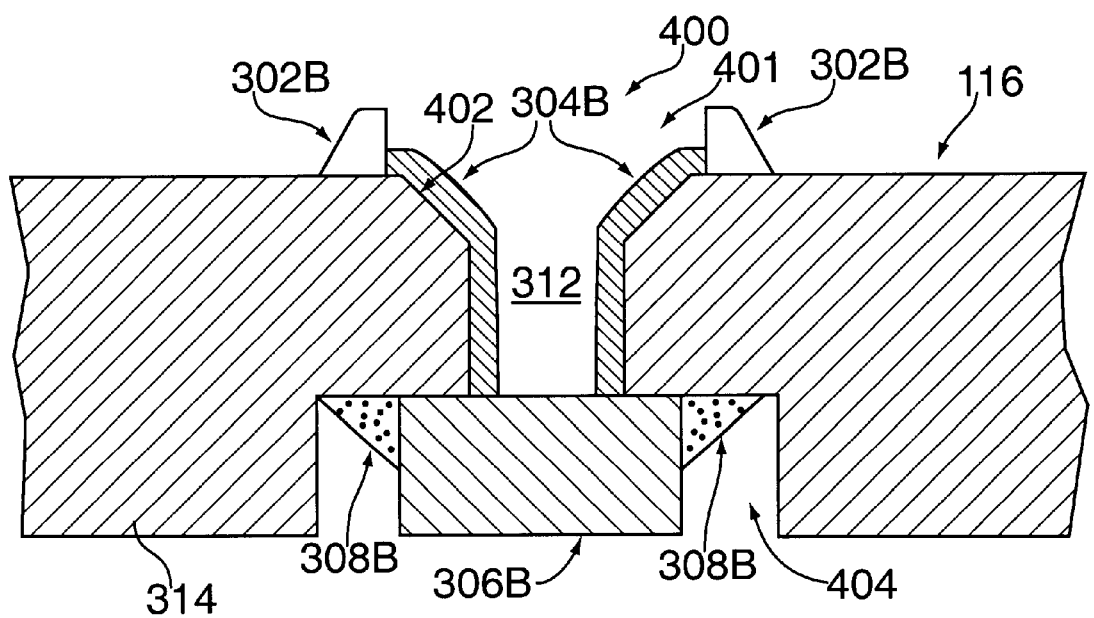
FIG. 4A depicts a cross-sectional view of an alternative embodiment of the feedthrough of the present invention.
Figure 4B:
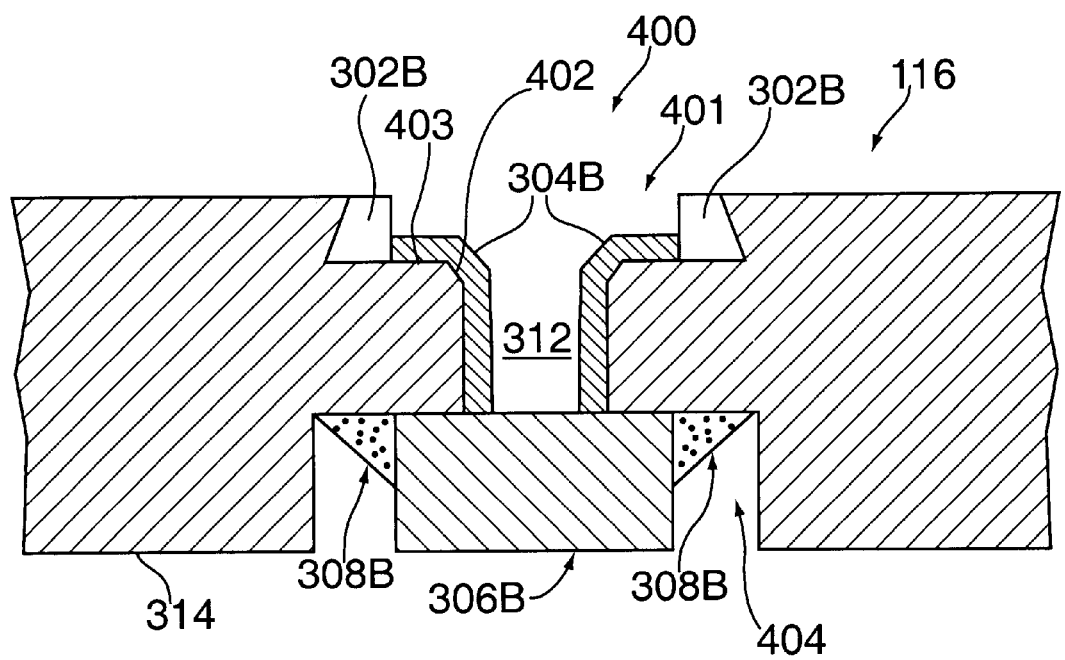
FIG. 4B depicts a cross-sectional view of an alternative embodiment of the feedthrough of the present invention.

FIG. 4A illustrates an alternative embodiment of the present invention. The feed-through 400 differs in two areas having to do with the ends of the bore. First, the top end 401 of the bore 312 is countersunk 402 into the chuck 116. Countersinking the top end 401 facilitates the deposition of the conductive material 304B used to coat the inside of the bore 312. A second difference is found in the underside end of the bore 312, which is counter-bored 404 and flush with the underside of the chuck 116. As such, the underside electrode 306B is embedded in the underside surface 314 of the chuck 116. In FIG. 4B, the first end of the bore 312 can also be counterbored 403, such that the surface electrode 302B is positioned within the counterbore 403 and is flush with the top side 310 of the chuck 116. These differences merely illustrate alternative methods which may be used to connect the electrodes to the chuck 116, and it will be apparent to those skilled in the art that other similar alternatives are possible without departing from the spirit and scope of the present invention.

Figure 5:
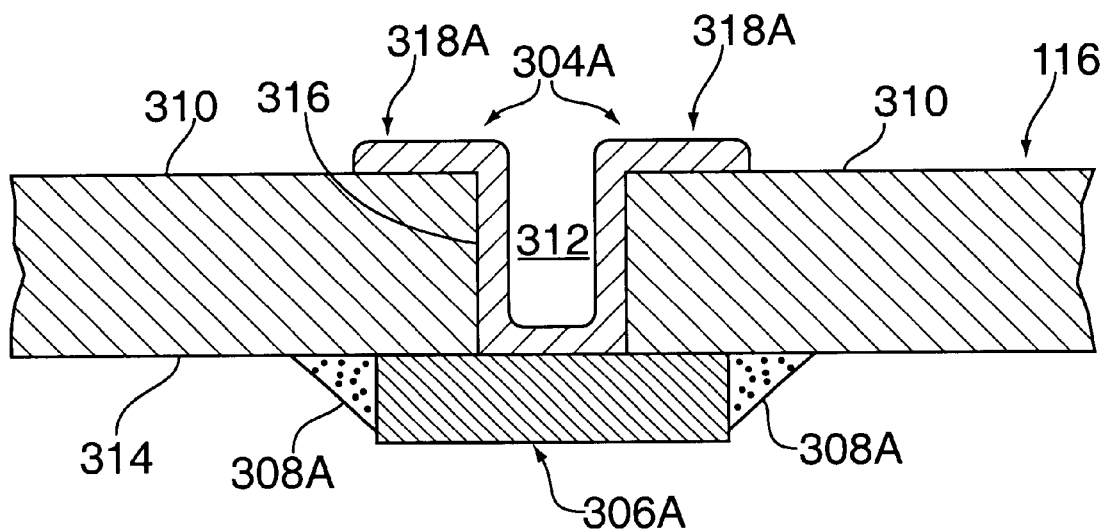
FIG. 5 depicts a cross-sectional view of an alternative embodiment of the feedthrough of the present invention.

FIG. 5 illustrates another alternative embodiment of the present invention. This is similar to the embodiment illustrated in FIG. 3, except that the surface electrode 302A is absent. Instead, the conductive material 304A is deposited to create an electrical contact with the underside electrode 306A, with the conductive material 304A covering the side wall 316 and extending over a certain portion of surface 310. The portion of the conductive material over surface 310, shown as 318A in FIG. 5, may also serve as a surface electrode. Any suitable deposition technique such as CVD, PVD, electroplating or brazing can be used, but the deposited material 304A must provide good electrical contact between the underside electrode 306A and the surface portion 318A.

Figure 6B:
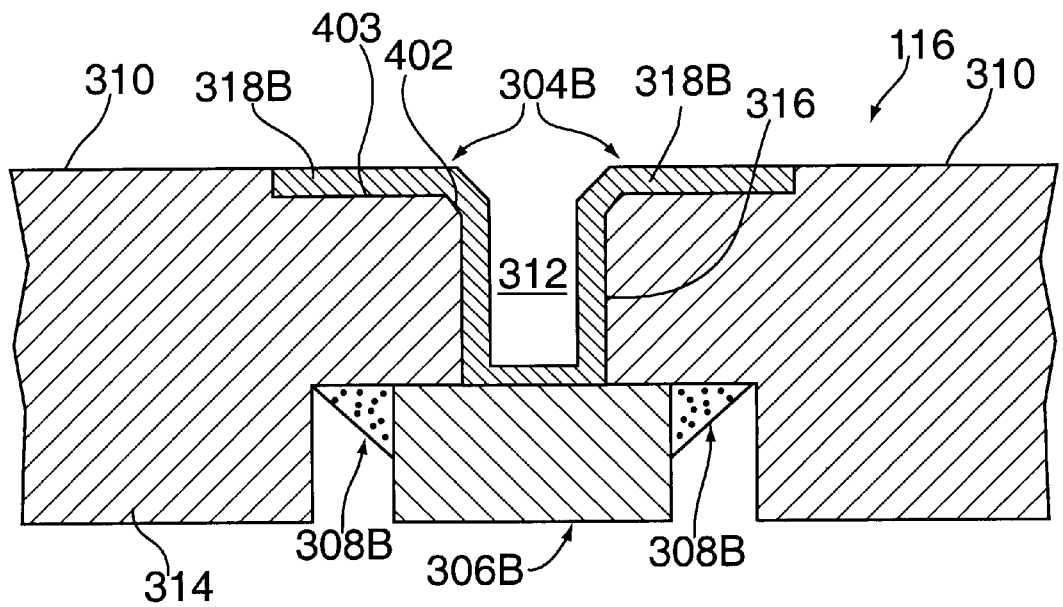
FIG. 6B depicts a cross-sectional view of an alternative embodiment of the feedthrough of the present invention.
Figure 6A:
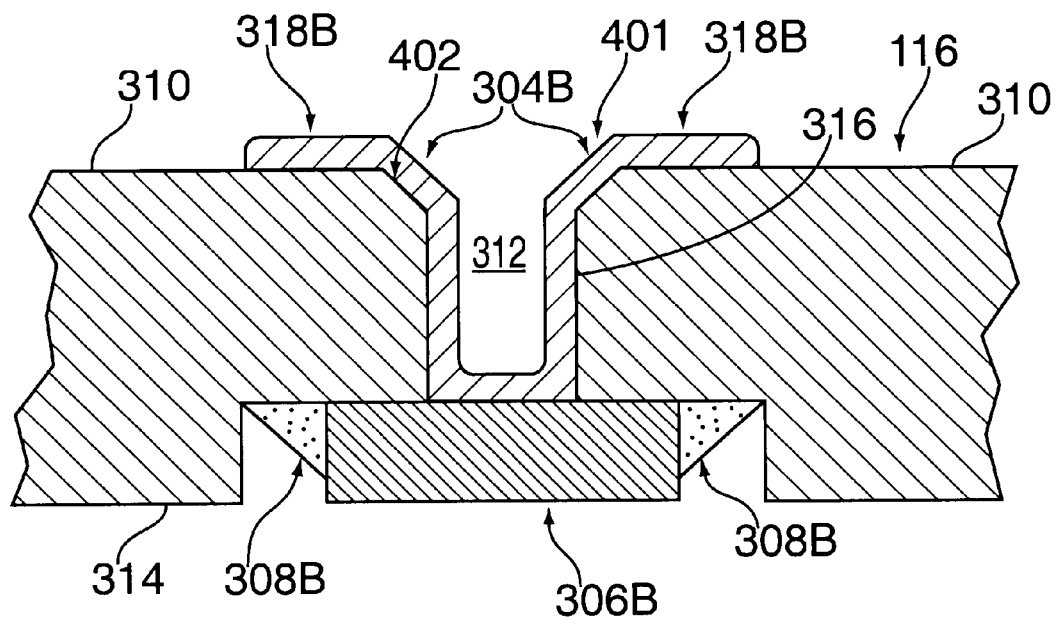
FIG. 6A depicts a cross-sectional view of an alternative embodiment of the feedthrough of the present invention.

FIG. 6A illustrates yet another alternative embodiment of the present invention. This is similar to the embodiment illustrated in FIGS. 4A and 4B, except that the surface electrode 302B is absent. Instead, the conductive material 304B is deposited to create an electrical contact with the underside electrode 306B, with the conductive material 304B covering the side wall 316 of the bore 312 and extending over a certain portion of surface 310. This portion of the conductive material over surface 310, shown as 318B in FIGS. 6A and 6B, may also serve as a surface electrode. Again, it is important that a good electrical contact be established between the underside electrode 306B and the portion 318B, which extends over surface 310. As previously discussed, counter-sinking one end of the bore 312 (FIG. 6B) can facilitate deposition of the conductive material 304B along the side wall 316, while counter-boring will allow the electrode 306B to be positioned in the counterbore, flush with the underside 314 of the chuck 116.

Although various embodiments which incorporate the teachings of the present invention have been shown and described in detail herein, those skilled in the art can readily devise many other varied embodiments that still incorporate these teachings.

What is claimed is:

1. A conductive feed-through for a dielectric body having a first side and a second side, comprising:
    a bore extending through said dielectric body, where said bore includes a first side opening and an second side opening;
    a surface electrode joined to said first side of said dielectric body;
    a second side electrode joined to said second side of said dielectric body;
    a vacuum-tight seal connecting said second side electrode to said dielectric body; and
    a conductive coating along the surface of said bore, where said conductive coating is electrically connected to said surface electrode and said second side electrode.

2. The conductive feed-through of claim 1, where said first side opening is counter-sunk.

3. The conductive feed-through of claim 1, where said first side opening is counter-bored, and said surface electrode is positioned in said counterbore.

4. The conductive feed-through of claim 1, where said second side opening is counter-bored and said second side electrode is positioned in said counterbore.

5. The conductive feed-through of claim 1, wherein said surface is formed by said conductive coating.

6. A conductive feed-through for a dielectric body having a first side and a second side, comprising:
    a bore extending through said dielectric body, where said bore includes a first side opening and an second side opening;
    an electrode joined to said second side of said dielectric body;
    a vacuum-tight seal connecting said electrode to said dielectric body; and
    a conductive coating along the surface of said bore extending over said first side of said dielectric body, where said conductive coating is electrically connected to said electrode.

7. The conductive feed-through of claim 6, where said first side opening is counter-sunk.

8. The conductive feed-through of claim 6, where said second side opening is counter-bored and said electrode is positioned in said counterbore.

9. The conductive feed-through of claim 6, where said first side opening is counter-bored.

10. The conductive feed-through of claim 9, wherein said conductive coating is positioned in said counterbore to define a surface electrode.

11. A semiconductor wafer support assembly having at least one conductive feed-through extending through a dielectric body having a first side and a second side, comprising:
    a bore extending through said dielectric body, where said bore includes a first side opening and an second side opening;
    a surface electrode joined to said first side of said dielectric body;
    a second side electrode joined to said second side of said dielectric body;
    a vacuum-tight seal connecting said second side electrode to said dielectric body; and
    a conductive coating along the surface of said bore, where said conductive coating is electrically connected to said surface electrode and said second side electrode.

12. The conductive feed-through of claim 11, where said first side opening is counter-sunk.

13. The conductive feed-through of claim 11, where said first side opening is counter-bored, and said surface electrode is positioned in said counterbore.

14. The conductive feed-through of claim 11, where said second side opening is counter-bored and said second side electrode is positioned in said counterbore.

15. The conductive feed-through of claim 11, wherein said surface electrode is formed by said conductive coating.

16. A semiconductor wafer support assembly having a conductive feed-through extending through a dielectric body having a first side and a second side, comprising:
- a bore extending through said dielectric body, where said bore includes a first side opening and an second side opening;
- an electrode joined to said second side of said dielectric body;
- a vacuum-tight seal connecting said electrode to said dielectric body; and
- a conductive coating along the surface of said bore extending over said first side of said dielectric body, where said conductive coating is electrically connected to said electrode.

17. The conductive feed-through of claim 16, where said first side opening is counter-sunk.

18. The conductive feed-through of claim 16, where said second side opening is counter-bored and said electrode is positioned in said counterbore.

19. The conductive feed-through of claim 16, where said first side opening is counter-bored.

20. The conductive feed-through of claim 19, wherein said conductive coating is positioned in said counterbore to define a surface electrode.

* * * * *